(12) United States Patent
Mokhlesi

(10) Patent No.: US 7,397,707 B2
(45) Date of Patent: *Jul. 8, 2008

(54) COMPRESSED EVENT COUNTING TECHNIQUE AND APPLICATION TO A FLASH MEMORY SYSTEM

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/468,661

(22) Filed: Aug. 30, 2006

(65) Prior Publication Data

US 2007/0070692 A1 Mar. 29, 2007

Related U.S. Application Data

(63) Continuation of application No. 10/718,454, filed on Nov. 19, 2003, now Pat. No. 7,113,432, which is a continuation-in-part of application No. 10/656,658, filed on Sep. 4, 2003, now abandoned, which is a continuation of application No. 10/033,222, filed on Dec. 27, 2001, now Pat. No. 6,643,187, which is a continuation of application No. 09/662,032, filed on Sep. 14, 2000, now Pat. No. 6,345,001.

(51) Int. Cl.
  *G11C 16/04* (2006.01)
(52) U.S. Cl. ............ 365/185.33; 365/236; 365/189.07; 365/185.11
(58) Field of Classification Search ............ 365/185.33, 365/236, 189.07; 711/100, 104–105, 162–163, 711/217–219
  See application file for complete search history.

(56) References Cited

U.S. PATENT DOCUMENTS

| 5,043,940 | A | 8/1991 | Harari |
| 5,172,338 | A | 12/1992 | Mehrotra et al. |
| 5,200,959 | A | 4/1993 | Gross et al. |

(Continued)

FOREIGN PATENT DOCUMENTS

JP S61-100565 6/1986

(Continued)

OTHER PUBLICATIONS

Ross, "Stochastic Processes," by John Wiley & Sons, Inc., pp. 1-141, 1993.

(Continued)

*Primary Examiner*—David Lam
(74) *Attorney, Agent, or Firm*—Davis Wright Tremaine LLP

(57) ABSTRACT

A non-volatile flash memory system counts the occurrences of an event, such as the number of times that individual blocks have been erased and rewritten, by updating a compressed count only once for the occurrence of a large number of such events. Complementary embodiments include updating the compressed count based upon a random number or upon the actual count matching a multiple of the fixed number. These techniques also have application to monitoring other types of recurring events in flash memory systems or in other types of electronic systems. In another aspect of the present invention, provisions are made to maintain an accurate experience count if the memory system experiences an improper shutdown, for example in case of power loss or removal of a memory card.

20 Claims, 5 Drawing Sheets

U.S. PATENT DOCUMENTS

| | | |
|---|---|---|
| 5,270,979 A | 12/1993 | Harari et al. |
| 5,315,541 A | 5/1994 | Harari et al. |
| 5,341,339 A | 8/1994 | Wells |
| 5,369,754 A | 11/1994 | Fandrich et al. |
| 5,404,485 A | 4/1995 | Ban |
| 5,414,861 A | 5/1995 | Horning |
| 5,428,621 A | 6/1995 | Mehrotra et al. |
| 5,430,859 A | 7/1995 | Norman et al. |
| 5,438,549 A | 8/1995 | Levy |
| 5,519,663 A | 5/1996 | Harper, Jr. et al. |
| 5,532,962 A | 7/1996 | Auclair et al. |
| 5,568,423 A | 10/1996 | Jou et al. |
| 5,598,370 A * | 1/1997 | Niijima et al. ......... 365/185.33 |
| 5,602,987 A | 2/1997 | Harari et al. |
| 5,606,529 A | 2/1997 | Honma et al. |
| 5,625,791 A | 4/1997 | Farrugia et al. |
| 5,663,901 A | 9/1997 | Wallace et al. |
| 5,673,383 A | 9/1997 | Sukegawa et al. |
| 5,712,180 A | 1/1998 | Guterman et al. |
| 5,799,168 A | 8/1998 | Ban |
| 5,799,200 A | 8/1998 | Brant et al. |
| 5,860,082 A | 1/1999 | Smith et al. |
| 5,937,425 A | 8/1999 | Ban |
| 5,963,970 A | 10/1999 | Davis et al. |
| 6,026,027 A | 2/2000 | Terrell, II et al. |
| 6,076,137 A | 6/2000 | Asnaashari |
| 6,081,447 A | 6/2000 | Lofgren et al. |
| 6,125,435 A | 9/2000 | Estakhri et al. |
| 6,230,234 B1 | 5/2001 | Estakhri et al. |
| 6,295,577 B1 | 9/2001 | Anderson et al. |
| 6,307,779 B1 | 10/2001 | Roohparvar |
| 6,345,001 B1 * | 2/2002 | Mokhlesi ............... 365/185.33 |
| 6,388,259 B1 | 5/2002 | Murdock |
| 6,418,506 B1 | 7/2002 | Pashley et al. |
| 6,643,187 B2 * | 11/2003 | Mokhlesi ............... 365/185.33 |
| 6,977,847 B2 | 12/2005 | Lasser et al. |
| 7,113,432 B2 * | 9/2006 | Mokhlesi ............... 365/185.33 |
| 2002/0156983 A1 | 10/2002 | Jones et al. |

FOREIGN PATENT DOCUMENTS

| | | |
|---|---|---|
| JP | 401205792 A | 8/1989 |
| WO | WO 00/16182 | 5/2000 |
| WO | WO 01/22205 | 3/2001 |

OTHER PUBLICATIONS

Notification of the First Office Action for Application No. 01817411.6 from The Patent Office of the People's Republic of China mailed Aug. 26, 2005, 5 pages.

Examiner's Report for European Patent Application No. 01 968 605.4 dated Feb. 12, 2007, 1 page.

* cited by examiner

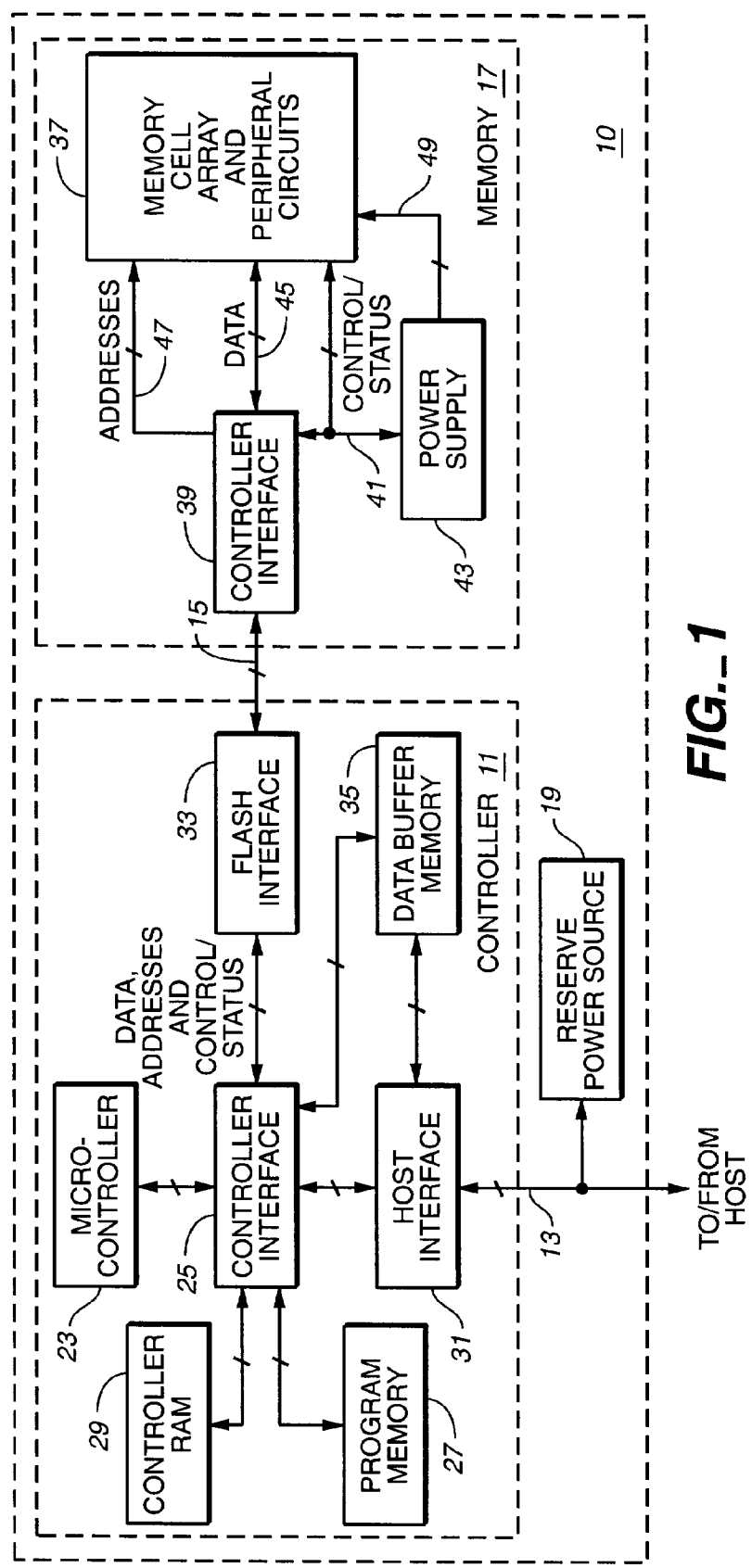
FIG._1

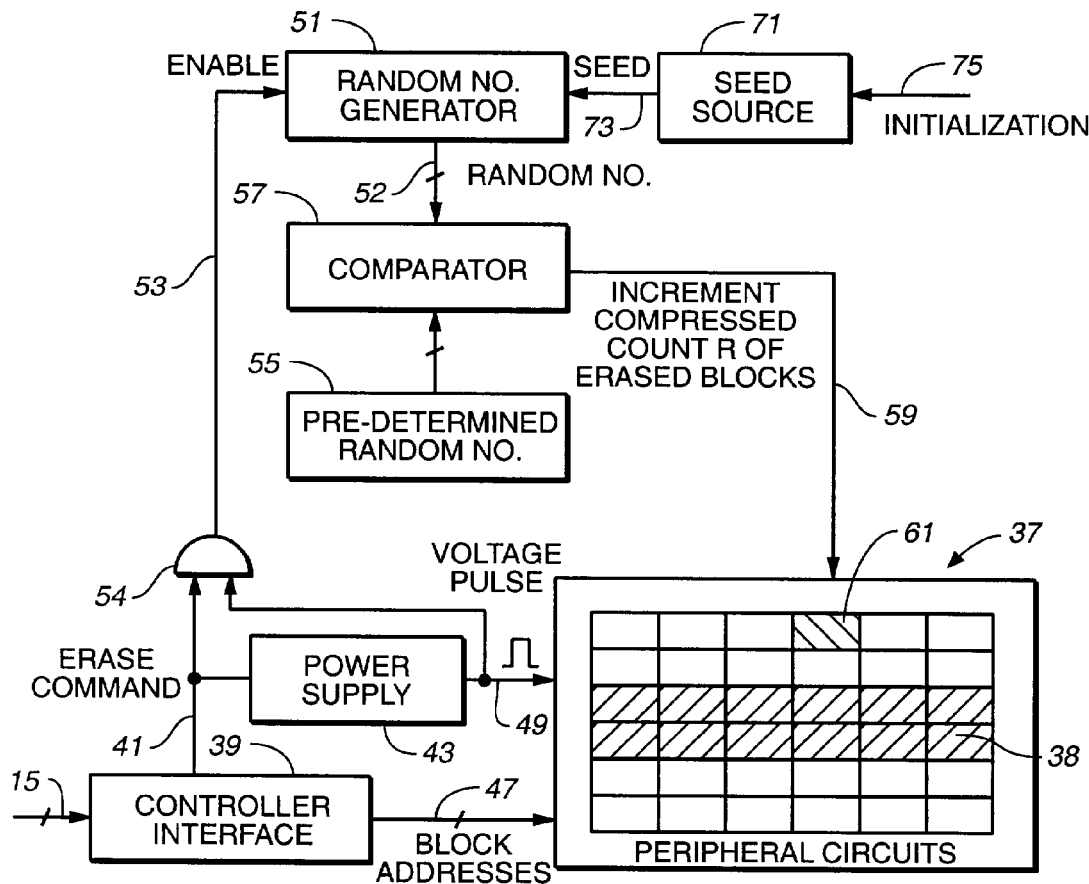
FIG._2
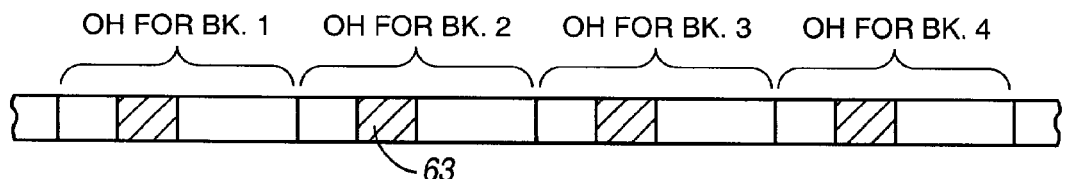
FIG._3 RESERVED BLOCK
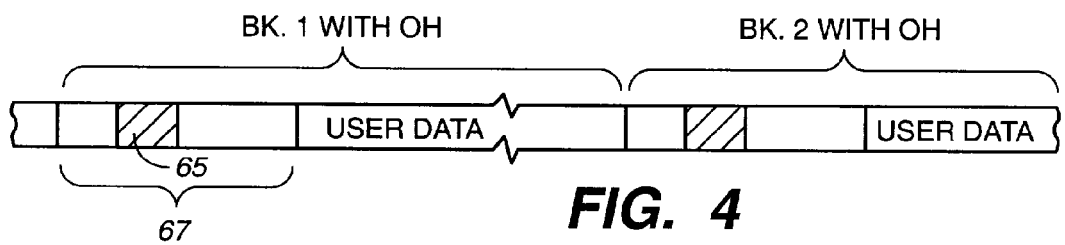
FIG. 4

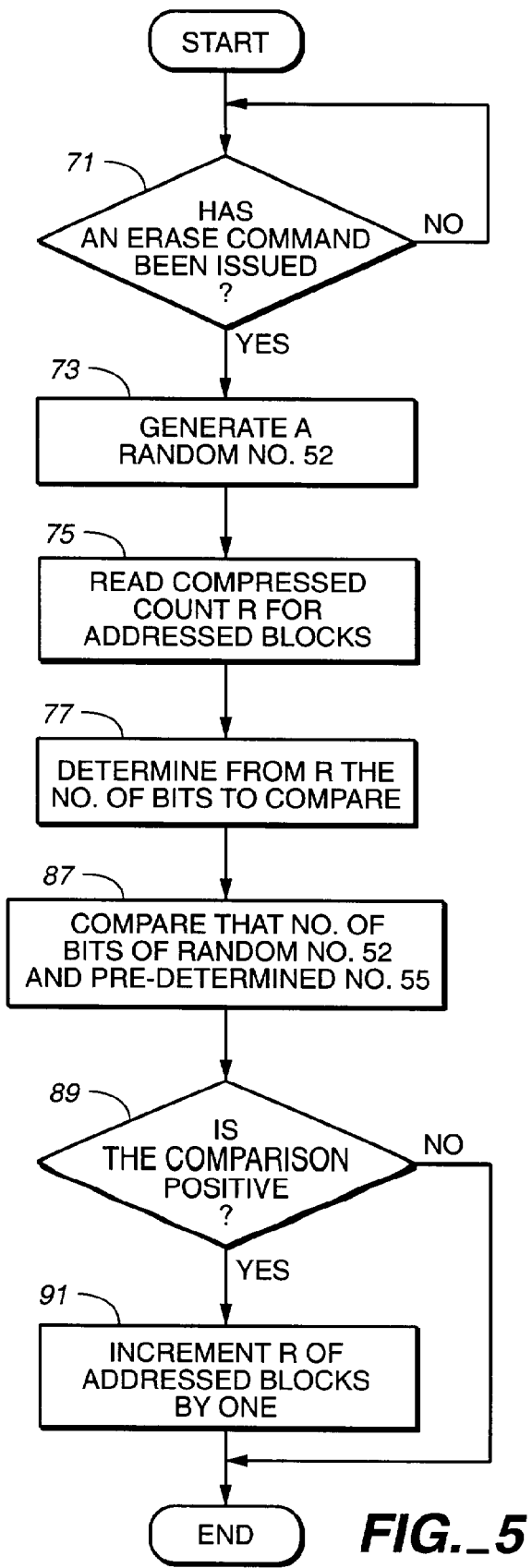
FIG._5

| COMPRESSED COUNT R | NO. BITS COMPARED | PROBABILITY P |
|---|---|---|
| 0-15 | — | 1.0 |
| 16-31 | 1 | 0.5 |
| 32-47 | 2 | 0.25 |
| 48-63 | 3 | 0.125 |
| 64-79 | 4 | 0.0625 |
| 80-96 | 5 | 0.03123 |
| ⋮ | ⋮ | ⋮ |
| 240-255 | 16 | 0.0000305 |
FIG._6
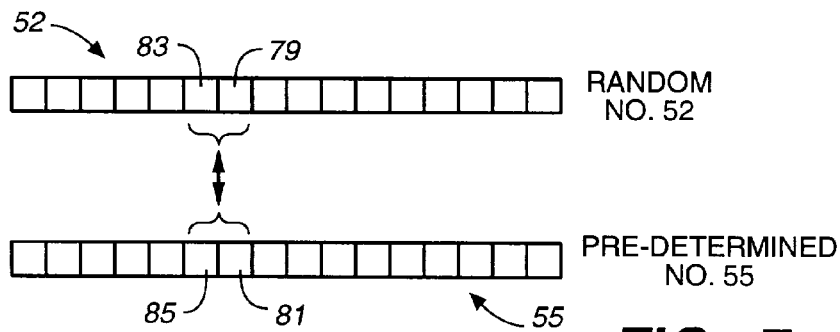
FIG._7
| COMPRESSED COUNT R | ACTUAL COUNT R | ERROR (STD. DEVIATION) |
|---|---|---|
| 0 | 0 | 0 |
| 1 | 1 | 0 |
| 2 | 2 | 0 |
| ⋮ | ⋮ | ⋮ |
| 15 | 15 | 0 |
| 16 | $17 + X_{16}$ | $Y_{16}$ |
| ⋮ | ⋮ | ⋮ |
| 31 | $47 + X_{31}$ | $Y_{31}$ |
| 32 | $52 + X_{32}$ | $Y_{32}$ |
| ⋮ | ⋮ | ⋮ |
| 47 | $111 + X_{47}$ | $Y_{47}$ |
| 48 | $119 + X_{48}$ | $Y_{48}$ |
| ⋮ | ⋮ | ⋮ |
FIG._8

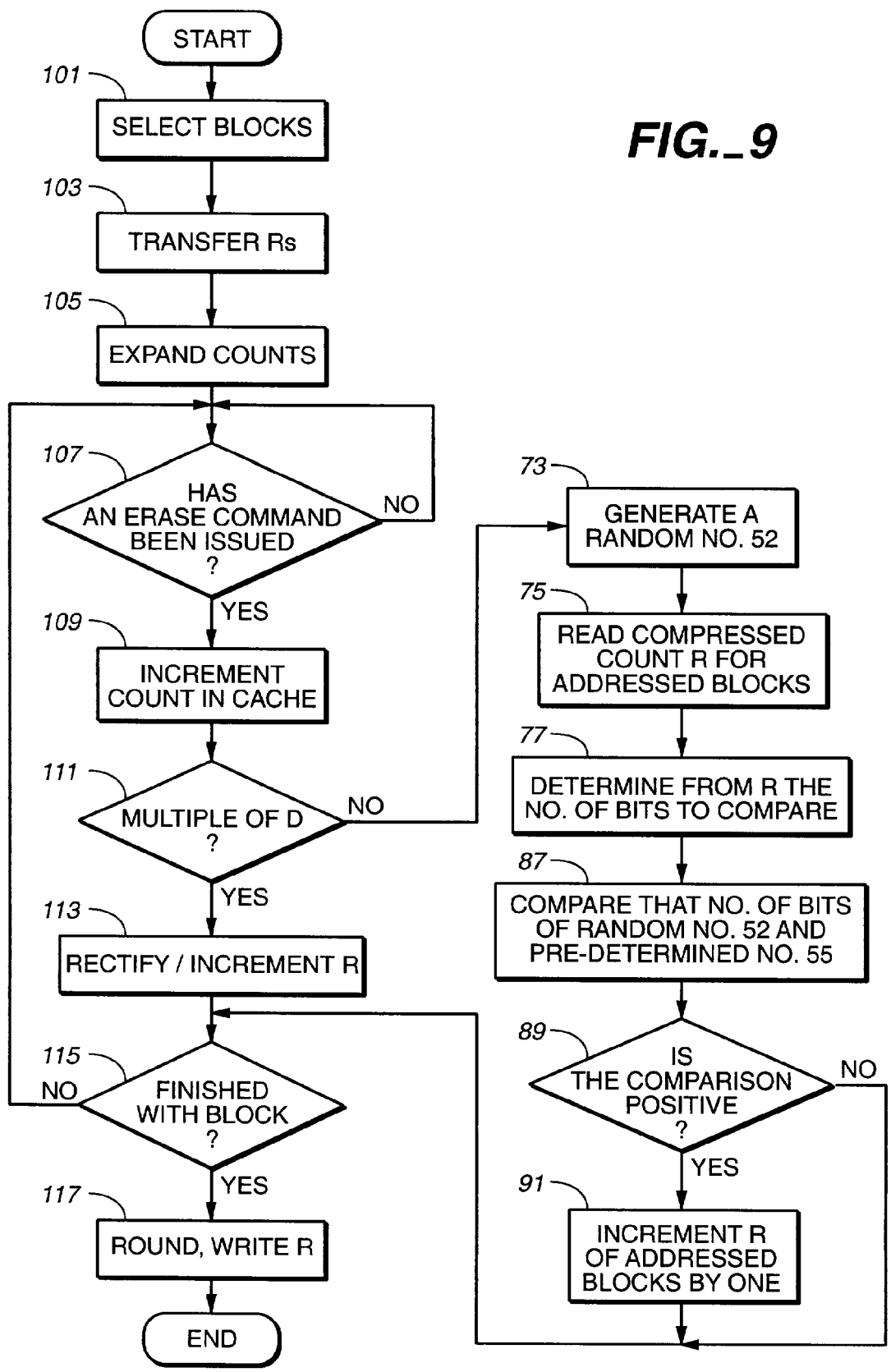
FIG._9

US 7,397,707 B2

COMPRESSED EVENT COUNTING TECHNIQUE AND APPLICATION TO A FLASH MEMORY SYSTEM

This is a continuation of application Ser. No. 10/718,454, filed Nov. 19, 2003, now U.S. Pat. No. 7,113,432, which is a continuation-in-part of application Ser. No. 10/656,658, filed Sep. 4, 2003 now abandoned, which is a continuation of application Ser. No. 10/033,222, filed Dec. 27, 2001, now U.S. Pat. No. 6,643,187, which is in turn a continuation of application Ser. No. 09/662,032, filed Sep. 14, 2000, now U.S. Pat. No. 6,345,001, which are incorporated in their entirety herein by this reference.

BACKGROUND OF THE INVENTION

This invention relates generally to event counting techniques, and, more specifically, to the application of such techniques to semiconductor memory systems, particularly to non-volatile flash electrically-erasable and programmable read-only memories (EEPROMs).

Flash EEPROM systems are being used in a wide variety of applications, particularly when packaged in an enclosed card that is removably connected with a host system. Current commercial memory card formats include that of the Personal Computer Memory Card International Association (PCM-CIA), CompactFlash (CF), MultiMediaCard (MMC) and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include an array of memory cells, peripheral operating circuits and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than or equal to the capacity of the memory block, often being equal to the standard disk drive sector size, which is 512 bytes.

In one commercial architecture, the memory system block is sized to store one sector of user data plus overhead data, the overhead data including information such as an error correction code (ECC) for the user data stored in the block, a count of the number of times that the block has been erased and reprogrammed, defects and other physical information of the memory cell block, and programming and/or erase voltages to be applied to the block. Various implementations of this type of non-volatile memory system are described in the following United States patents and pending applications, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and patent applications Ser. No. 08/910,947, filed Aug. 7, 1997, and Ser. No. 09/343,328, filed Jun. 30, 1999. In another commercial architecture, the overhead data for a large number of blocks storing user data are stored together within tables in other blocks. This overhead data includes a count of the number of times that individual user data blocks have been erased and reprogrammed. An example of such a system is described in U.S. patent application Ser. No. 09/505,555, filed Feb. 17, 2000. Yet another type of non-volatile memory system utilizes a larger memory cell block size that stores multiple sectors of user data.

The number of erase/reprogramming cycles experienced by individual memory blocks (their "experience count") is often maintained within a flash memory system for one or more reasons. One reason is to determine when a block is reaching its end of lifetime, in order to replace it with another block by mapping it out of the system before it fails from overuse. This is described in U.S. Pat. No. 5,043,940, for example, which patent is incorporated herein by this reference. Current commercial floating gate memory cells have a lifetime of from several hundred thousand to one million erase/reprogramming cycles, which is often larger than any of the blocks are cycled in most applications during the useful life of the memory. However, other more reprogramming intensive applications can reach such numbers. Another reason for keeping track of the block experience counts is to be able to alter the mapping of data into the various blocks in order to even out their wear before they reach their ends of lifetime as a way of extending the life of the memory system. Examples of such wear leveling techniques are given in U.S. Pat. No. 6,081,447, which patent is incorporated herein in its entirety by this reference. Yet another reason for maintaining block experience counts is to be able to adjust programming and other operating voltages to take into account changes in characteristics of the memory cells that occur as the number of erase/reprogramming cycles increases.

SUMMARY OF THE INVENTION

Rather than keeping track of each occurrence of an event, it is noted only each time a large number of events has occurred. One advantage is that a compressed count R, representative of the number of events A that has occurred, needs to be updated less frequently than if each of the events is counted. Another advantage is that, in a binary counting system, a fewer number of bits are required to maintain a count R that is representative of a larger number of events A. A preferred technique for maintaining the compressed count R includes establishing some probability P that the compressed count R will be updated each time that the event being monitored occurs. This results in updating the compressed count R, on average, once every 1/P number of actual events. This probability is preferably chosen to be as independent of the operation of a system in which the events are occurring as is practical, so that the influence of the system operation upon the frequency of updating the compressed count R is minimized.

In the specific examples described herein, this technique is utilized to monitor the number of some repetitive event that occurs as part of operating an electronic system. A random number generator is preferred for use to determine when the compressed count R of the number of events is updated, a pseudo-random number generator usually being used in practice. A random number is generated when the event occurs, preferably each time the event occurs. One of the random numbers is preferably designated as a trigger to cause the compressed count R to be updated, such as by being incremented to the next number in order. This will occur, on the average, once every N events, where N is the total possible number of distinct random numbers that is generated over time by the random number generator. Rather than each occurrence of the event being counted, therefore, the compressed count R is updated on average once every N events, and that count represents 1/N th the number of events that have occurred, on average. Or, to say it in a different way, the probability P that any one occurrence of an event will result in the compressed count R being updated is 1/N. A product of R and N gives the number of actual events A that has occurred, if that is needed, within a margin of probable error that is proportional to 1/P, which is to say that the likely error goes up as N goes up since P=1/N.

These techniques have particular application to digital memory systems. In the example of non-volatile flash memory systems described in the Background above, updating the compressed count R of an event, such as the erase/reprogramming event, need occur less frequently, so less time is taken away from other operations of the memory. This results in such other operations, such as user data programming, occurring faster. The number of bits required to store the count for each of the blocks is also significantly reduced. Further, the complexity of the operation of the memory system is reduced when each occurrence of the event need not be counted.

In an application of this technique to maintain an experience count (sometimes called a "hot" count) of the number of erasures and reprogramming cycles occurring in a flash memory, the number N is selected to be a small fraction of M, where M is the expected life of the memory in terms of a maximum number of erase/reprogramming cycles that a memory cell can safely experience before there is danger of very inefficient operation or outright failure. Although the resulting compressed count R does not allow knowing exactly the number of events A that have occurred, it's relative accuracy increases as the number of events A grows and particularly when approaching the end M of the memory block's lifetime. The number of bytes of storage space required for the experience count can be significantly reduced since the maximum compressed count R over the life of the memory is M divided by N, rather that being M in the case where every erasure event is counted. Since updating of the compressed count occurs only once for many erasure events, the overall performance of the memory is improved. In addition, the flash memory system is easier to maintain and debug.

The probability P that any particular one of such events will cause the compressed count to be updated need not necessarily be kept the same for the entire time that the events of the memory or other electronic system are being counted but rather can, for example, be varied as a function of the number of events A being monitored. Specifically, if it is desired to maintain a more accurate compressed count R of the erasure/reprogramming events of a flash memory at low values of the actual count A, the probability P is maintained high at the beginning of operation and decreased during the lifetime of the memory as the actual count A becomes large. This is particularly useful, as a specific example, when the compressed count R is being used by the system to control the voltages applied to the memory cells of a particular block during its programming and/or erase, since those voltages are often changed at low levels of the actual experience count A. This ability is provided without having to devote more bits to the storage of the compressed count R for the individual blocks.

In an alternate embodiment, rather than using a random or pseudo-random number match to update the compressed count, the actual experience count A is compared to a fixed number. In an exemplary embodiment, the compressed count R is copied from the non-volatile memory to the volatile controller memory where the actual experience count is incremented as events occur. When the actual experience count, A, matches a multiple of the fixed number, the compressed count stored in the non-volatile memory is incremented. This embodiment can be combined with the embodiment using a random or pseudo-random number: the compressed count can be incremented as previously described using a pseudo-random number match, and then rectified using the fixed number.

In another aspect of the present invention, provisions are made to maintain an accurate experience count if the memory system experiences an improper shutdown, for example in case of power loss or removal of a memory card. The memory system can contain enough reserve power so that when it detects an improper shut down, the actual experience count can be compressed and stored in the non-volatile memory so that this information is not lost.

Additional aspects, features and advantages of the present invention are included in the following description of specific representative embodiments, which description should be taken in conjunction with the accompanying drawings.

BRIEF DESCRIPTION OF THE DRAWINGS

FIG. 1 is a schematic block diagram of a memory system that incorporates event monitoring of the present invention;

FIG. 2 is a block diagram that conceptually illustrates operation of the memory system of FIG. 1 to keep a compressed count of events occurring within it;

FIG. 3 illustrates one form of non-volatile storage within the memory system of FIG. 1 of a compressed count of the events according to the techniques shown in FIG. 2;

FIG. 4 illustrates another form of non-volatile storage within the memory system of FIG. 1 of a compressed count of the events according to the techniques shown in FIG. 2;

FIG. 5 is a flow chart of a specific example of the operation of the memory system of FIG. 1 according to FIG. 2;

FIG. 6 is a table used with the example operation of FIG. 5;

FIG. 7 shows a comparison of two binary numbers that is used in the example of FIG. 5;

FIG. 8 is another table used in the example of FIG. 5; and

FIG. 9 is a flow chart of a specific example of the operation of the memory system of FIG. 1 according an alternate embodiment.

DESCRIPTION OF REPRESENTATIVE EMBODIMENTS

FIG. 1 is a diagram of some of the major components of a typical non-volatile memory system. A controller 11 communicates with a host system over lines 13. The controller 11, which may occupy its own integrated circuit chip, communicates over lines 15 to one or more non-volatile memories in parallel, one memory 17 being illustrated. The memory 17 includes a memory cell array and associated peripheral circuits 37, which may, along with a controller interface 39, be formed on a separate integrated circuit chip.

User data is transferred between the controller 11 and the memory 17, in this example, over the lines 15. The memory 17 is addressed by the controller. Specifically, the data bus within the lines 15 can be one byte wide. The memory system shown in FIG. 1 can be embedded as part of a host system or packaged into a card, such as a card following one of the card standards previously mentioned. In the case of a card, the lines 13 terminate in external terminals on the card for mating with a complementary socket within a host system. Although use of one controller chip and multiple memory chips is typical, the trend is, of course, to use fewer separate chips for such a system by combining their circuits. An example capacity of the illustrated memory 17 is 256 Mbits, thus requiring only two such memory chips, plus the controller chip, to form a non-volatile memory system having a data capacity of 64 megabytes. Use of a single smaller capacity memory chip results in a memory system of lesser capacity, an 8-megabyte system being a marketable example. Conversely, use of memory chips with a higher bit storage density and/or use of more memory array chips in a system will result in a higher capacity memory. Such memory systems up to 1.3 gigabyte and more are practical.

The controller 11 includes a microprocessor or micro-controller 23 connected through controller interface logic 25 to internal memories and interfaces with external components. A program memory 27 stores the firmware and software accessed by the micro-controller 23 to control the memory system operation to read data from the connected memory array(s) and transmit that data to the host, to write data from the host to the memory array(s), and to carry out numerous other monitoring and controlling functions. The memory 27 can be a volatile re-programmable random-access-memory (RAM), which is then initialized by data from some form of non-volatile memory, a non-volatile memory that is not re-programmable (ROM), a one-time programmable memory (OTP) or a re-programmable flash EEPROM system. If the memory 27 is re-programmable, the controller can be configured to allow the host system to program it. A random-access-memory (RAM) 29 is used to store, among other data, data from tables read from the non-volatile memory that are accessed during reading and writing operations.

A logic circuit 31 interfaces with the host communication lines 13, while another logic circuit 33 interfaces with the memory array(s) through the lines 15. Another memory 35 is used as a buffer to temporarily store user data being transferred between the host system and the memory 17. The memories in the controller are usually volatile, except for that storing operating firmware, since memories with fast access and other characteristics desired for efficient controller operation have that characteristic. The several volatile memories may conveniently be combined physically into a single memory.

The logic circuit 39 of the memory 17 interfaces with the controller through the lines 15. The purpose of the logic circuit 39 is to generate signals for the memory cell array 37 that are delivered over separate buses and control lines. Various control signals are provided in lines 41. A data bus 45 carries user data being programmed into or read from the non-volatile memory, and an address bus 47 carries the addresses of the portion of the memory being accessed for reading user data, writing user data or erasing blocks of memory cells. A power control circuit 43 provides, in response to control signals in the circuits 41, various voltages and currents as required to operate the memory cell array 37 through lines 49. Included are voltages to bit lines and gates of the memory cell array 37 that are appropriate for programming, reading or erasing certain of those cells that are designated by an address in lines 47.

In one typical flash memory implementation, the memory cells of the array are divided into blocks wherein each block is the smallest erasable unit of memory cells, all cells within an individual block being simultaneously erasable. Typically, a number of blocks are erased at the same time, and programming data into the memory array occurs in blocks that have first been erased. In a common example, each block holds 512 bytes of user data plus a number of bytes of overhead data associated with the user data and/or associated with the block of memory cells in which the overhead data are stored. Such a block is formed of two rows of memory cells, in one specific current implementation. In another example, each block holds 32768 (=64×512) bytes of user data plus overhead data.

As an alternative to storing the overhead data in the same block as the user data, some or all of the overhead data may be stored in other blocks that are dedicated for that purpose.

One of the items of overhead information associated with each block of current flash memories in a number of flash EEPROM systems is the number of erase/reprogramming cycles the block has experienced. This block experience count is useful for many purposes, the primary ones having been described earlier. When a block experience count is updated to note an event of either the block's erasure or reprogramming, the current experience count stored for the block in the non-volatile memory is first read and stored in a temporary memory, usually volatile memory within the controller. This read count is then updated to represent the occurrence of a subsequent event, such as by incrementing the count by one, and the updated count is then rewritten back into the non-volatile memory block. This involves a significant number of operations that take time and which thus negatively impact upon the performance of the memory system.

According to a principal implementation of the present invention, the experience counts are not updated each time that their associated blocks are erased and reprogrammed. Rather, a compressed count is updated less frequently at an average rate that is related by a proportional constant to the rate of the erase/reprogramming events being counted. For example, if a flash memory has a life of approximately 1,000,000 erase/reprogramming cycles, and the compressed count is updated only once in approximately 4000 cycles, then the updating process occurs only 1/4000 as often over the occurrence of a large number of cycles. The amount of time devoted to updating the compressed experience count during operation of the memory is significantly less than when an experience count is updated by each event. In addition, the number of bits necessary to store the count being maintained is significantly reduced from that required to maintain the actual count, so the space taken in the non-volatile memory to maintain the count is significantly reduced. If an actual count of 1,000,000 cycles is kept, for example, about 3 bytes is required for every block to count each number from 1 to 1,000,000. If an average of only every $4000^{th}$ event is counted, on the other hand, the maximum count is about 250, and this may be maintained in one byte. The savings in overhead memory space is thus two bytes per block, in this example.

An indication of the actual number of events experienced by a block is always available by multiplying the maintained count by 4000, in this example, but the memory system operating firmware stored in the controller memory 27 preferably works with the compressed count directly as an indication of the usage of the individual blocks. The same advantages of improved performance and reduced memory space requirements result by reducing the frequency of updating the monitoring the count of the occurrences of any other event, whether within a non-volatile memory or in some other electronic system.

A preferred technique for maintaining the compressed count includes generating a series of random numbers wherein a new number is generated in response to each new event and the compressed count is updated each time the generated random number is equal to a predetermined selected one of those numbers. For example, if a generator of random numbers from 1-4000 is employed, where a new number is generated each time the event occurs, and a particular number, say 2750, is selected to update the maintained count when it occurs, the compressed count will be updated each time the random number generator output is equal to 2750. On average, this will occur once each 4000 events. Although there is not a precise relationship between the number of events that have occurred and the compressed count, there is a close correlation, particularly after a large number of events has occurred. It has been found that the accuracy of the compressed count is sufficient for the purposes of the example being described, particularly after several hundred thousand events have occurred. This is when the experience count information becomes quite useful, in the example application being described, for determining when individual blocks of memory need to be replaced.

FIG. 2 conceptually illustrates this process implemented in the non-volatile memory system of FIG. 1, as an example. A random number generator 51 outputs in lines 52 a new random number each time an increment pulse is applied in a line 53. The increment pulse occurs at the beginning of a voltage pulse in the line 49 at a time when a command in lines 41 designates an erase operation. This combination of signals is to be identified by an AND-gate 54. It is during such an erase voltage pulse that one or more memory cell blocks 38 of the memory 37, as designated by an address in lines 47, are simultaneously erased. In one specific implementation, 16 blocks are erased at the same time. Typically, a single erase voltage pulse is applied.

One number contained within the set of numbers associated with the random number generator is stored in a predetermined location within the system in a non-volatile manner, as indicated by 55. Each new number in lines 52 that is generated by the random number generator 51 is compared with that stored in the memory 55 by a comparator 57. When the two numbers match, a signal in a line 59 causes the compressed count R to be updated for each of the blocks that is currently being erased. When the comparison is negative (i.e., the two numbers do not match), which will be the case most of the time, no such update takes place. This comparison can be implemented in hardware using logic gates, in software or in firmware depending on speed requirements, the need for flexibility and cost considerations.

In one embodiment, the counts are maintained for a number of user data blocks in a single one of many reserved blocks, such as a reserved block 61. An outline of the data structure for such a reserved block is given in FIG. 3. Several bytes of overhead data are maintained in such a block for each of a large number of other blocks that store user data, that number depending upon the capacity of the various blocks. The overhead ("OH") data for memory cell block 2, for example, includes a byte 63 of the compressed count that is updated when a match occurs between the random number generator output 52 and the stored number 55.

In another embodiment, instead of the counts being maintained in a separate reserved block 61, they are stored as part of the blocks for which the counts are being maintained. For example, with reference to FIG. 4, a compressed count byte 65 is stored as part of overhead data 67 for a memory cell block 1, the majority of the cells in the block storing user data. Thus, when a number of blocks are erased together, the compressed count of each block is updated when the random number 52 matches that stored at 55 at the time of the erase operation. Nothing is done at that time with the compressed count of other blocks not being erased.

Yet, in another embodiment, the counts are stored in a block that is exclusively devoted to storing the counts and no other kind of overhead data.

The random number generator 51 may be implemented according to any one of many known hardware and/or software techniques. In a specific implementation, however, the function of the random number generator 51 is carried out by the micro-controller 23 of the memory controller 11 (FIG. 1). The micro-controller 23 is generally idle for the duration of an erase pulse, so it can be used during such pulses to perform the functions of generating a new random number 52 and comparing that number with the pre-determined number 55 to determine whether a match exists or not. A standard shift and exclusive-OR algorithm is used, wherein a 32 bit value is stored in the controller RAM 29 and a 12 bit random (actually pseudo-random by this technique) number is generated in lines 52 from it in response to each erase command. A 12 bit number provides 4096 different possible combinations. If the lifetime of the memory is about one million cycles, then one byte will store the compressed count that is representative of the actual number of events. On the occurrence of each erase event, the probability P of the generated random number 52 matching the number stored in 55 is one in 4096.

The random number generator, to provide more detail, uses a 32 bit shift register formed in the controller RAM 29 (FIG. 1). Every new random number is generated by repeatedly performing an exclusive-OR operation on the second and third least significant bits of the shift register, and feeding the resultant bit to the most significant bit of the shift register during a shift operation of all the 32 bits of the shift register. To generate a new 16 bit random number, this operation is repeated 16 times. Then the 4 most significant bits of the 16 least significant bits of the shift register are masked by performing an AND operation between the 16 least significant bits of the shift register, and the hexadecimal number 0FFFh (0000 1111 1111 1111 in binary form). So every time the 12 least significant bits of the shift register become 000h (0000 0000 0000 in binary form) the output of the logical AND operation becomes one, and there is a hit (match) in the sense that, on such occasions, the compressed count R is incremented. If all 32 bits of the shift register ever become identically zeros, then from that point on all subsequent random numbers generated will also be zero. So, if this does happen, the random number generator is re-seeded.

It will be noted that the probability P may be generated by some means other than the random number generator 51 specifically described above. Examples include using system noise, tunneling events in single electron devices, radio active decay in a certain time interval, and other events that randomly occur in some hardware, firmware or software device. Other suitable random number generating techniques are additionally described below for use in developing a seed to initialize the random number generator 51.

Upon the memory system being initiated, as the result of being powered up from an un-powered condition, the random number generator 51 needs to be set to an initial value in order to begin the process. This is done by a seed source 71 that is triggered by an initialization signal in line 75 to provide an initial value seed 73 to the random number generator 51.

There are many alternative seed sources that can be employed. One is to store, in a non-volatile manner, the last value 52 of the random number generator 51 during operation of the memory system prior to the initialization. The random number generator 51 is then forced to begin with that stored number. But using a random number or non-correlated number source as the seed also performs satisfactorily. In systems that include a time clock, the generated time is a pseudo-random series of numbers, the number existing at the time of initialization being used as the seed for the random number generator 51. Alternatively, a second random number generator, of the same or different design than the random number generator 51, may be used to select a seed. For the random number generator specifically described above, re-seeding includes initializing all 32 bits of the shift register.

Yet another alternative technique for generating a seed involves reading user data in a block of the memory which can be read in a normal manner. But to assure a higher degree of randomness, in case the data does not change between initializations, that reading is performed, in one specific implementation, with margin threshold levels that are separated by amounts far in excess of those normally used for reading data. This is intended to assure, due to the marginality of the readings, that many errors will occur in reading that data, preferably in a manner that at least some of the same data are read differently at different times. To further increase the randomness of the seed, an address of a second block may be generated from this intentionally erroneously read data, and the data in the second block is read in the same manner that is likely to erroneously read the data. This can be continued for a further number of cycles if additional assurances of randomness are desired.

In the description given above, it has been assumed that the probability P of a match occurring remains the same throughout the life of the memory system. There can be applications, however, where it is desired to vary the probability P in some manner, such as in response to some relevant condition that changes or to a related event that occurs. That probability can be altered, if desired, by changing the number of predetermined numbers in the storage 55 with which each of the random numbers 52 from the generator 51 is compared. The compressed count is updated each time there is a match of the generated random number with any of the one, two or even more predetermined numbers in the storage 55. As the number of predetermined numbers within the storage 55 that are made available for comparison with the random number outputs of the generator 51 is altered, the probability P of a match occurring for any given random number is changed.

As an alternative to changing the number of stored predetermined numbers that are compared in order to alter the probability, the number of bits of a single number in the storage 55 and the individual random numbers that are compared may be altered, in a digital system. For example, if the random number output 52 of the random number generator 51 is 12 bits and the predetermined number stored at 55 is also 12 bits, the lowest probability of a match (one in 4096) occurs when a positive comparison of all 12 bits is required. But if only two bits in the same location of each number are compared, as another example, there is a much higher probability of a match (one in four) occurring as the result of each comparison. This, in effect, alters the total number of possible different random numbers that may be generated by the random number generator, and, in that way, changes the probability that any one random number will match the pre-determined number. The number of bits of the two numbers that are compared, and thus the total number of possible random numbers, is easily altered under firmware or software control in response to a user's selection, or automatically changed in response to a change being detected in some other condition or event of the memory system.

One specific application in a flash memory system of varying the probability of a match occurring is described with respect to the flowchart of FIG. 5. This operating method increments the compressed count R more often at lower numbers of R which usually correspond to lower numbers of the actual counts A than at higher numbers, thus resulting in the compressed count R more accurately representing the actual count A at the lower numbers. The resolution of the compressed count R at lower numbers is thus improved. This can be accomplished without having to increase the number of bits required to store the compressed count R by initially using a high value of P at low values of R, and proceeding to lower values of P (which can become lower than 1/4096 and in fact can become as low as 1/32768) at higher values of R. By using this approach, an integer R ranging from 0 to 255 can represent counts as high as 1 million for the high-count range, and as low as single digit numbers for the lowest count range. In the specific flash EEPROM system example described herein, the total number of binary random number bits that are compared to the same number of bits of the pre-designated number can be designed to be a function of the value of the compressed count R of each block being erased.

In the specific example being described with respect to FIGS. 5-8 to illustrate this feature, both of the random number 52 generated by the generator 51 (FIG. 2) and the stored predetermined number 55 are each 16 bits in length. A different number of the bits of each are compared by the comparator 57, depending upon the value of the compressed count R. Fewer bits are compared (thus a higher probability of a match occurring) at lower values of the compressed count R than at higher values (where the probability of a match occurring is lower). The compressed count R is stored in one byte, having a range of 0-255.

Referring to FIG. 5, a first step 71 in a summary of the process is to determine when an erase operation is being performed. When this occurs, in a step 73, the random number generator 51 is caused to generate a random number 52 (see also FIG. 7). In a next step 75, the compressed count R for the blocks that are currently addressed for erase is read from its non-volatile record 61. This is not shown in FIG. 2 but will be understood to be implemented by the micro-controller 23 (FIG. 1) which preferably also performs the processing illustrated in FIG. 2, as previously mentioned. A table such as that illustrated in FIG. 6 is stored in non-volatile memory of the controller for use during a next step 77. The logic represented by this table can be implemented in hardware, firmware, or software.

The number of bits of the numbers 52 and 55 (FIG. 7) that are to be compared is determined by looking up the read compressed counts Rs in the table of FIG. 6 for each of the blocks being erased in its left-hand column and reading the number of bits to be compared in its middle column. A right hand column of FIG. 6 provides, as information for this explanation, the probability P that a match will occur between the bits of the numbers 52 and 55 that are compared. It will be noted that no bits are compared for the lowest values 0-15 of R since they equal respective ones of the actual count values 0-15 of A. On each occurrence of the erase event for blocks whose R is 15 or less, therefore, that R is incremented by one. But within a next range where R is within 16-31, one bit of each number, such as the bits 79 and 81 in the same bit positions of each of the numbers 52 and 55, are compared. There is thus a probability of 0.5 that a match will occur in each instance. In a next range of R between 32-47, two bits, such as bits 79 and 83 of the number 52 and bits 81 and 85 of the number 55, are compared, resulting in a probability of 0.25 that a match will occur in any one instance. As the compressed count R increases to its highest range of 240-255, 15 of the 16 bits are compared, resulting in a very low probability (1 in 32768) that a match of 15 of the 16 bits will result from any one comparison.

The number of bits of the numbers 52 and 55 are looked up in the table of FIG. 6, the comparison then occurring in a step 87 (FIG. 5). A next step 89 determines whether on an individual block basis there is a match or not. If so, the compressed count R of only those individual blocks that have satisfied the match within the addressed blocks that were read in the step 75 is incremented by one, in a step 91. If no block in the group of blocks being erased produces a match, then the process ends with respect to the blocks being erased, and receipt of another erase command is awaited by the step 71.

Although the examples being described include incrementing various numbers, one or more could be decremented instead, from a high value to a low value. It is not usually important how the compressed count R is updated to record the fact of a positive comparison between the numbers 52 and 55, for example, whether by incrementing by one or more each time, by decrementing by one or more each time, or by some other technique, so long as R is updated in a manner that a meaningful value can be read when necessary.

A table such as that illustrated in FIG. 8 is also optionally included as part of a software package used by failure analysis engineers in order to relate the compressed count R to the actual count A in those cases where an estimate of A needs to be known. (In most cases, the memory system firmware can operate from the count R itself since its relationship to the count A is a known one.) For a first group 93 of values of the compressed count R, in the left hand column, the actual count A, shown in the middle column, is the same. A statistical standard deviation of errors between R and A, given in the right-hand column, is zero for this group. In a next group 95 of the table of FIG. 8, corresponding to the second line of the table of FIG. 6, the values of R are not equal to the values of A. Rather, since each R count in this group is incremented approximately once for each two occurrences of A, the value of A is roughly 15, the top value of the first group 93, plus two times the number of counts R in the left column in excess of 15. Similarly, the value of A for any given value of R in a next group 97, corresponding to the third line of the table of FIG. 6, is the value of A for the top value 31 of R in the last group 95 plus roughly four times the counts of R in excess of that top count 31 of the prior group 95. This relationship continues through all possible values of the count R.

The relationship between the counts R and A are usually not those roughly determined as above, particularly as the value of R becomes high, because of the incremental contribution of a combination of the effects of different probability values in the different ranges of R represented by prior groups 93, 95, 97, etc. As a result, the middle column of the table of FIG. 8 includes an extra unknown term x. Although the relationship between R and A can be approximated by a mathematical model that includes the x terms, it is usually preferred to empirically generate the expectation values (i.e. the mean values) of A for each given R in the middle column of the table of FIG. 8. The memory system in which this process is being implemented is best operated by subjecting at least one group of blocks to a number of erase events, either actual or simulated, that extends from zero to the maximum number expected to be experienced by that type of memory. Both the compressed count R that is maintained by the system and an actual count A of the number of erase cycles are monitored during the test. The latter gives the values for the middle column of FIG. 8. By using the actual memory system to generate the actual counts A that correspond to the compressed counts R, various imperfections of the random number generator 51 and other portions of the system and process are taken into account. Mathematically modeling all such factors with accuracy is difficult.

The error numbers in the right-hand column of FIG. 8 are also best determined by such an empirical technique, when it is desired to include them. The counts R and A are maintained during a large number of cycles of a number of memory blocks, and the differences among the different blocks are statistically expressed in some manner, such as by a standard deviation of a population of such differences. This column can be useful for the purposes of evaluating various tradeoffs between desired precision and necessary memory space required to store the counts, and diagnoses by the user of the memory system, but will usually not be used by the controller 11 during operation of the system.

In an alternate embodiment of the present invention, the compression count R can be based on a fixed number D instead of a random or pseudo-random number. Instead of updating the compressed count R, on average, once every 1/P occurrences of the event, the compressed count is now updated every D occurrences. For example, D could equal 1000 or $2^{10}$ and the compressed count R would be incremented every $1000^{th}$ or $1024^{th}$ time the actual event occurs. The various details and implementation variations of the random number implementations also apply to the fixed number implementations, except now the actual experience count A is compared with the predetermined number (or numbers) D.

In an exemplary embodiment, the occurrence is the experience count of the memory cell array 37 of FIG. 1. When a write unit of the array is being operated upon, the compressed count R associated with the sector is transferred from the memory 17 to the controller and expanded. If the associated predetermined number is D, the expanded count is the R×D, which, as described below, is the actual experience count to the nearest multiple of D and is now treated as the actual experience count A. The expanded experience count is then stored in RAM 29 in the controller's cache. As the block experiences a number of erase/reprogramming cycles, the controller increments the corresponding actual experience count A in its cache.

As the actual experience count A is incremented, if it has increased by a multiple of D the compressed count R stored in the non-volatile memory can be incremented. This can be determined in a number of standard ways, for example if $D=2^n$ just keeping the $n^{th}$ least significant bits of A and noting when this value goes through zero. Alternately, instead of incrementing the compressed count R every $D^{th}$ occurrence, the controller can wait until it is through with the block and write the compressed count then. In either case, when the erase/reprogramming cycles for the block are through, the full number of occurrences will have been transferred to the non-volatile memory with the remainder rounded either up or down depending on the embodiment.

Alternately, the compressed count R can be incremented directly as with the pseudo-random number embodiments, but using the number D instead a pseudo-random number. Also, as with the pseudo-random number embodiments, the value of D can be varied as A increases, with the value of D increasing as A becomes larger.

One method that can be used to keep track of the compressed count is to use a "walking bit" scheme. Normally, every update of a compressed count in the memory would require writing an entire new sector, so that in order to just change the value of the one bite representing the compressed count, an entire sector consisting of 512 user bytes has to be written. Among other issues, this would increase the wear on the sectors that contain the counts. A walking bit scheme can be used to reduce the wear, although it would also reduce the capacity of a sector to store such count values. In such a scheme, a string of bits starts as all 0's, and beginning at one end, the 0's are sequentially flipped to 1's with each update. Thus, at any given time, the string of bits would be a series of all 1's, followed by a series of all 0's. In general a byte can take 256 different values, but a walking byte can only take 8 different values. However, as a compressed count can be saved in far less space than a full, uncompressed count, this disadvantage can be offset and the advantage of only having to change a single bit, rather than writing a whole sector, can be gained.

The fixed number embodiment can also be combined with the random or pseudo-random number embodiments, with the random number technique described above being rectified when the expanded count corresponds to the fixed number D. For example, the compressed count can be updated, on average, every $P=2^{12}$ or $4096^{th}$ occurrence, as described above. Due to fluctuations, the compressed count will not correspond directly, but approximately, to P times the compressed count: $A \sim P \times R$. To correct for the fluctuations, using the fixed number embodiment and by taking D larger than P, say $D=2^{2+12}$ in this example, the compressed count can be rectified every D occurrences. FIG. 9 illustrates the alternate embodiment of the present invention based on a fixed number D.

FIG. 9 is a flow chart for the alternate embodiments and is similar to the flowchart of FIG. 5 of the random number embodiments. In step 101, a block is selected for erase/program operations and the compressed experience count is transferred to the controller in step 103. The compressed count is expanded and stored in cache in step 105. In a fresh block, the compressed count R and actual count A will both be zero. For other blocks, the compressed count R expands to $A=D \times R$, where D is the predetermined compression factor. If the compression factor varies as the function of some other factor, such as the value of the compressed count with a smaller value of D for smaller A values, R will be expanded appropriately.

On expanding, a first step 107 of the process is to determine when an erase operation is being performed, corresponding to step 71 of FIG. 5. When this occurs, in a step 109, the expanded count A is incremented in the cache memory. As before, although the examples being described include incrementing various numbers, one or more could be decremented instead, from a high value to a low value. A comparison of any incremented expanded counts with the appropriate predetermined value of D then occurs in a step 109. A next step 111 determines whether on an individual block basis there is a match or not between the corresponding A and a multiple of the D. The logic for this process can be implemented in hardware, firmware, or software.

If step 111 finds that A is a multiple of D, the compressed count R in the non-volatile memory portion of only those individual blocks that have satisfied the match within the addressed blocks that were read is incremented by one in step 113. In a embodiment also using the random number based incrementation, in step 113 the value of R is rectified; that is, the value of R is set to the same value it would have if random number based incrementation were absent. Depending on how many random number matches have occurred since the last time step 113 was executed, the value of R may be increased, decreased, or left unchanged. For example, if three matches have occurred since the last execution of step 113, R would be decremented by two.

If step 111 finds that A is not a multiple of D, step 115 follows directly for embodiments without also using the random number based incrementation. If the embodiment does also use the random number based incrementation, steps 73-91 of FIG. 5 are instead executed on the way to step 115. These steps can be performed by the micro-controller 23 (FIG. 1), in the non-volatile memory as previously described with respect to FIG. 2, or with the various steps divided between the micro-controller 23 and memory 17.

Step 115 determines whether the controller is finished with any of the individual blocks. If not, the process returns to step 107 to await another erase command. If so, the actual count A is compressed and the compressed count R in the non-volatile record 61 is incremented or rectified in step 117 and the process ends for that particular block, although it may continue for other blocks. The compression of A in step 117 can be a rounding process, either rounding up or down to a multiple of D depending on the embodiment.

Although the examples described herein are for maintaining a count of the number of erase/rewrite cycles experienced by blocks of a flash EEPROM system, these techniques can also be applied with similar advantages to counting other events in such a system, particularly when a separate count of an event is maintained for each block or group of blocks of memory cells. One example is to count the number of times that individual blocks are subjected to margin scanning data recovery techniques, as an indication of some problem with those blocks. Another example is to count the number of times that an error correction code (ECC) was actually engaged in order to recover the user data of an otherwise unreadable sector. Another is to keep track of the number of times that blocks need to have the data therein refreshed to their proper margin levels by scrubbing in order to compensate for disturbances that have occurred over time. In these and other situations, a large number of such events experienced by a block, a sub-block (sector), or a group of blocks gives an indication that there is some problem with them. The memory controller can use this information to replace the block, sub-block, or the group of troubled blocks, or take some other remedial action.

The prevalent types of flash memory can be divided into two distinct categories in terms of the size of the erase block in relation to the size of the program block, namely large erase block type and small erase block type. NAND flash memories usually have large erase blocks each of which consists of many program blocks. (Relevant examples of such arrays and their operation are given in U.S. patent application Ser. No. 09/893,277, filed Jun. 27, 2001, that is hereby incorporated by reference, and references contained therein.) A program block usually consists of 512 Bytes of user memory plus additional Bytes of overhead memory reserved for error control coding and other purposes. A program block is sometimes referred to as a sector (or a page in case of NAND). NAND memory physical blocks are commonly composed of 16 cells long flash cell chains, 32 cells long chains, or 64 cell long chains. At the two ends of each chain or string of cells that are connected in series (i.e. source of one cell is the drain of a neighbor cell) each of which chains is oriented along the direction of the bit lines, there exist two select transistors (i.e. Select Gate Drain and Select Gate Source which connect the individual strings to the corresponding bit line and to a source line respectively). Cells on odd bit lines are usually not written at the same time as the cells on the even bit lines.

There exist a new type of NAND architecture called All Bit Line (or ABL) where the cells on odd and even bit lines are simultaneously programmed. (Relevant examples of such arrays and their operation are given in U.S. patent applications Ser. No. 10/254,483, filed Sep. 24, 2002, and Ser. No. 10/665,828, filed Sep. 17, 2003, that are hereby incorporated by reference, and references contained therein.) For the purposes of the example to be presented here consider the prevalent non-ABL architecture. In a common architecture up to 8 planes of the memory are programmed in parallel in order to increase the programming performance. Each plane consists of several blocks only one of which can be written to at any given time. Within each block only a single word line is programmed at any given time. In a non-ABL architecture, within each word line only half the cells are programmed simultaneously (either the even bit line cells or the odd bit line cells). In a Multi Level Cell (MLC) memory, the state space is divided into two distinct pages namely a lower page and an upper page. Therefore, each erase block in such a memory architecture consists of 2×2×16×8=512 pages=256 Kbytes of user memory, where one factor of 2 corresponds to upper verses lower page, another factor of 2 corresponds to odd verses even pages, the factor of 16 corresponds to 16 word lines per block (or 16 cells per NAND string), and the factor of 8 corresponds to 8 planes being programmed in parallel (requiring that the associated blocks in the 8 planes to be erased in parallel also). The erase block in this example consists of 512 pages. Because of the way the memory is managed, after each erase operation, every page in the block is written no more than a small number of times. Depending on the final data state of each cell, each cell is written to at most twice: once for the lower page data, and once for the upper page data. Each cell may experience partial exposure to some programming voltage conditions during the separate programming of the page headers. But, in all circumstances, keeping track of erase events is as useful as keeping track of programming events. Since erase block size granularity is much larger than programming block size, and erase operation are much less frequent than programming operations, it is much more efficient to keep track of erase operations than to keep track of programming operations.

The number of times each erase block has been erased can be stored in cells in the same erase block or it can be stored in cells that belong to another erase block. If the count is to be stored in the block itself, then there are several possible embodiments, for example: 1) a designated single page in each erase block has to contain a larger number of cells than the other pages in order to accommodate the extra Byte(s) associated with the count, 2) a single page has to accommodate less user data in order to accommodate the count, or 3) the typical 3 Bytes (equivalent to 12 cells in 4 level MLC products) required to store a non-compressed count have to be made available in every page. Depending on the implantation, option 1) may entail introducing irregularities in the 2 dimensional arrays that form each erase block. This is often not a preferred option when optical proximity effects are considered in creating the photo-lithographic masks required to print the irregular features. Option 2) is not optimal because system and host requirements often dictate that all the user portion of all pages be of the same size. Option 3) requires 511×3=1533 Bytes or 6132 extra cells that serve no other purpose than to keep the array regular and page size uniform.

As mentioned earlier, another option for storing the counts is to store them in another block. In this case another block dedicated to only storing hot-counts will be able to hold 512×512=262144 Bytes of counts. In one embodiment, one single Byte compressed count per erase block will be sufficient. Then an erase block will be able to contain hot-counts for 262,144 other erase blocks. The wear on such a hot-count containing erase block, and the performance penalty associated with updating the hot-counts may be overly large because on every occasion that the count associated with one of the 262,144 erase blocks is to be incremented, this erase block will have to be erased and rewritten also. Moreover, 262,144 erase blocks each of which consists of 262,144 Bytes comprise 68719 MB of memory. In other words, one erase block will be able to contain the hot-counts of 68 GB of memory.

If, as an example, the chance of incrementing is taken to be 1 in 1024, and a 4 GB card is considered, then one time erase of the entire 4 GB card will require 4(GByte)/262144(Byte/erase block)=15288≈16000 erase operations on roughly 16000 erase blocks. So, on the average 16000/1024≈16 updates (e.g. erases) of the erase block will be required for every time we erase and re-program the entire card. The hot-count dedicated erase block will have to endure 16 times more program/erase cycles. However, if the hot-count dedicated erase block is divided into 16 equal sections, each section would consist of 262,144/16=16384 Bytes which happens to closely match the number of erase blocks in a 4 GB card (i.e. about 16000). This means each one-sixteenth section of the hot-count dedicated erase block can store one update of the entire card's compressed hot-counts. Up to 16 updates can be performed before the erase block is exhausted, and an erase operation on the hot-count dedicated erase block will become necessary. For the above example, the wear on the hot-count dedicated erase block will be the same as the wear on any other block. In an exemplary embodiment, a convention can be adopted that the last written one-sixteenth of the hot-count dedicated erase block will contain the most recent and the valid non-volatile record of the compressed hot-counts for the entire 4 GB chip. To dedicate only one erase block to record the hot-counts of 16000 blocks is a considerable savings in the chip area used for keeping track of hot-counts. This becomes apparent when one in 16000 is converted to a hot count overhead area percentage of 0.00625%.

In terms of performance, once every 1024 times, on the average, that any erase block is erased, the corresponding hot-count dedicated sectors/pages will have to be updated with the compressed versions of the latest hot-count values in the RAM. Approximately 32 sectors or pages are required to store the hot counts of an entire 4 GB chip. Each 32 sectors segment will provide 16,384 Bytes for storing compressed hot-counts of 16,384 erase blocks.

The large erase block type memories have been considered in the example above. In an exemplary small erase block type memory, an erase block can be the same as a program block. In one particular case, a sector consisting of 512 user Bytes plus a few additional overhead Bytes will constitute both a programming block and an erase block. Because in this embodiment the size of the erase block is much smaller compared to the earlier example of a typical NAND memory, the hot-counts will have to be monitored and stored with smaller granularity. One hot-count Byte will have to be dedicated to each and every sector. Every time invasive operations (i.e. programming or erasing) are initiated in some area of the memory the hot-counts pertaining to the corresponding block of memory will be read from the hot-count dedicated sector which will, in one embodiment, contain single Byte long hot-counts pertaining to 512 other sectors. The issue of the wear associated with cycling (i.e. programming and erasing) these hot-count dedicated sectors is again a concern. As long as the probability of incrementing the hot-count is equal to or less than 1/512 there will be no issue. The use of compressed hot-count methods where a non-volatile programming event is triggered based on a small probability of obtaining a match between a designated number and a randomly generated number, introduces uncertainty in the accuracy with which the compressed counts represent the actual count. The following describes a variation to the technique which reduces the uncertainty for memory cards that are not often shut down without prior notice to the memory card. The following technique will allow the compressed count to be a more precise representation of the actual count for devices that are not improperly shut down by suddenly removing the power to them with no prior notice. Also, for applications where many program/erase operations are performed in most uninterrupted powered up sessions, the following technique will reduce the aforementioned uncertainty even more. The technique is described below.

In an exemplary embodiment, whenever an erase block is to be erased, the compressed counts ($R_1, R_2, R_3, \ldots, R_N$), where N represents the number hot-counts stored in one hot-count dedicated sector or page, are read from the non-volatile memory, uncompressed and these corresponding de-compressed counts ($A_1, A_2, A_3, \ldots, A_N$) are loaded in the controller RAM. For example N can be 512 for sectors/pages consisting of 512 user bytes, using the convention that each erase block's compressed hot-count is stored as a single Byte. Every time an erase block is erased (assuming that an erase operation is the event that triggers the incrementing), the corresponding $A_i$ value is incremented by 1 in the RAM, and the random number generator is also ran to create a chance of a match. When there is a match, the present values of ($A_1, A_2, A_3, \ldots, A_N$) are compressed in the manner described below, and the resulting compressed values are updated in non-volatile memory. After the update of hot-count dedicated sector/page, the values of ($A_1, A_2, A_3, \ldots, A_N$) that were last in RAM will remain there, and will continue to be incremented by one every time a corresponding erase block is erased. One possible method of compressing follows. For purposes of illustration let us assume that the compression ratio is a fixed value of 1024, meaning that one unit of a compressed count corresponds to 1024 erase operations. Then $$R_i = \text{INT}(A_i/1024) + F((A_i/1024) - \text{INT}(A_i/1024)),$$

where $\text{INT}(A_i/1024)$ is the integer value of ($A_i/1024$), and ($A_i/1024$)−$\text{INT}(A_i/1024)$ is the fractional value of ($A_i/1024$) modulo 1024.

To clarify this further the following example is provided. At some point when there is a match, and the non-volatile hot-count dedicated sector has to be update $A_3$=5347. Then ($A_3/1024$)=5.221679688, $\text{INT}(A_3/1024)$=5, and ($A_3/1024$)−$\text{INT}(A_3/1024)$=0.221679688. So for $A_3$, F will have the value 1 with probability of 0.221679688=227/1024, or the value of zero with probability (1−0.221679688). One way to generate this value or any other value for F is to generate a new 10 bit binary random number. If the value of this random number is less than $227_{10}=1110000011_2$, then F=1, otherwise F=0. The generated random number is 10 bits in order to match the compression ratio of $1024=2^{10}$. In one embodiment, a separate 10 digit random number can be generated for each and every of the 512 $A_i$'s. If the time to generate 512 distinct binary 10 digit random numbers is considered prohibitive and cannot be readily accommodated in the time it takes to erase the erase block, then as few as one binary 10 digit random number is sufficient, but still 512 comparison need to be performed because the fractional part of each of the 512 individual $A_i$'s will have to be calculated in order to completely update the entire sector. This is also the case for the case of the large erase block memories discussed earlier. In the case of the large erase block memory, all of the fractional parts of the approximately 16,000 $A_i$'s will be calculated every time there is a random number generated match, so that when it is decided to incur the cost of programming 32 sectors, we may have as well updated the entire set of compressed counts based on the latest values of all $A_i$'s.

It may be preferable to break up the job of calculating the fractional parts of all $A_i$'s, performing the comparisons between the random number generated and all the fractional parts, and the writing of the entire set of 32 sectors into 32 separate single sector write operations which can be time multiplexed with other real time operations that the host may be expecting from the memory chip.

Another issue of concern is the size of the RAM devoted to storing the entire set of $A_i$'s. The formerly discussed 4 GB NAND flash chip/card will have about 16000 Bytes of hot-counts in their compressed form. These 16000 $R_i$'s, once expanded into $A_i$'s, will require 16000×18/8=36000 Bytes of RAM memory where each 1 Byte $R_i$ has to be expanded into an 18 bit $A_i$, again assuming a fixed compression ratio of $1024=2^{10}$. An additional 36000 Bytes of SRAM will add 10% to the size of a typical currently manufactured controller chip which is fabricated using 0.18 micrometer technology and translates into an additional cost of a few pennies per controller.

In another embodiment, the entire set of $R_i$'s need not be loaded into RAM at time of power up. Instead, only the address, the time of update and the contents of those hot-count dedicated sectors that store hot-counts of erase blocks which are going to be erased will be loaded into the RAM at the time of the erase operation. If the entire capacity of the portion of the controller RAM dedicated to $A_i$'s is reached, then the least recently used set of $A_i$'s currently in the RAM will have to be compressed and stored in non-volatile memory, such that the RAM will be freed to hold the $A_i$'s corresponding to a group of erase blocks one or more of which are about to be erased. For memory architectures with small erase blocks, this latter embodiment may be the more practical option since with small erase blocks the number of $R_i$'s per, for example, a 4 GB card may be considered prohibitively large. If the erase blocks are single sectors, then the number of erase blocks per 4 GB card will be 4 GB/512B=7712500 requiring over 17 MB of controller RAM to store all the $A_i$'s.

In another aspect of the present invention, provisions is made for preserving the count as maintained in the cache memory should the memory device be disconnected from the host or otherwise be improperly shut down. As the cache of the controller 11 (FIG. 1) is typically volatile RAM 29, this count would otherwise be lost. U.S. Pat. No. 5,602,987, which was incorporated by reference above, describes various aspects of the use of a cache memory structure in a non-volatile memory.

In one embodiment, the memory device 10 can contain a reserved power source 19, for example a capacitor that can be formed on the printed circuit board holding the non-volatile storage section 17 and the controller 11. In other embodiments, part or all of the reserve power can come from intrinsic or other capacitances of the controller 11 and memory 17. This reserve power can be used to write information stored in the cache to the non-volatile memory 17 if power from the host is lost; specifically, the reserve power can be used to compress the current actual count A and write the compressed count R to non-volatile memory.

Referring back to FIG. 9, the reserve power aspect of the present invention allows the process of FIG. 9 to go immediately to step 117 for all of the blocks currently selected upon indication of an improper shut down. For embodiments using the random number based updating of the compressed count R, either alone as in FIG. 5 or as incorporated into FIG. 9, since the compressed count is updated regularly between the rectification of step 113, the compressed count R stored in the non-volatile memory may be relatively accurate. Still, even in these cases, accuracy can be further improved by updating the compressed count in response to an indication of improper shut down.

Further, the counting techniques described above are not limited to use with flash EEPROM or other non-volatile memory systems. These techniques have application in any electronic system where it is necessary or desirable to keep a count of one or more events occurring in the course of the operation or by the use of the system. More generally, the system does not need to be electronic. In general, the system could be the count of any kind of event (e.g. mechanical), and even the random number generator does not have to be electronic. It can be mechanical or optical for instance. For example, these could be used to count other types of events that occur on a granular scale, such as defects.

Although the various aspects of the present invention have been described with respect to specific exemplary embodiments, it will be understood that the invention is entitled to protection within the full scope of the appended claims.

Appendix

A New Compressed Stochastic Integer Event Counter Scheme

This idea is applicable to any situation when a record of the number of times a certain event has occurred must be kept. The usual way of keeping track of the number of times an event has occurred is to devise a counter that is incremented every time an event takes place. If the maximum number of times the event can possibly occur is M times, then to store this information the counter requires $N=\log_2 M$ bits. So, as an example, if one wants to keep track of up to 1 million events, then one is forced to devote 20 bits≅3 Bytes to the storing of this count. Note that 20 bits=2.5 Bytes=20 bits, and $2^{20}=1048576$. Now, if many such event counters are required, then the total memory required to store all the counts can be substantial. This is exactly the case when it comes to implementing hot counts in flash memories on the basis of one counter per sector. Also, the updating of the hot count of each sector on every occasion that the sector is either programmed or erased can be a burden in terms of both performance speed of the memory and the wear produced by the frequent updating of the each sector's hot count. Each 512 Byte sector which has included hot count has traditionally required 3 extra Bytes to store the number of times the sector has been cycled (programmed and erased).

The Simple Approach Using a Fixed Probability of Incrementation

The new idea allows the compression of the 3 hot count Bytes per sector to 1 hot count Byte per sector. If one is willing to give up precision, then in its simplest form, the new hot count scheme is as follows: using a 12 bit pseudo-random number generator, one can generate a probability p (in this case p=1/4096=0.0002441). One way of generating this probability is by generating a random 12 bit binary integer on every occasion that a sector is being programmed, or erased. If this 12 bit integer matches a particular 12 bit integer (say 101111010001), then, and only then, will the counter corresponding to the sector that is about to be written be incremented. Note that $2^{12}=4096$. Every time a sector is programmed, there is a probability p that the counter of this sector is increment by the integer value 1. On the average, every 4096 programming events will increment the counter once.

Now, we have to distinguish between the actual count, A, which is the actual number of times a given sector has been programmed, and the representation of this count, R, which is roughly 4096 times smaller than A. What we record and keep track of is R=r. The value of R at any given time will not exactly determine the value of A=a, but will give a ball park estimate of the value of A. When R is small, then R is a very poor indicator of A, but as R becomes larger, then R becomes a more accurate indicator of A in a relative sense. Here "R", and "A" represent random variables, whereas "r", and "a" represent certain integer values that these random variables can take.

We can define E as the event of R being incremented. Then: Probability (E)=Pr(E)=p, and Probability (not E)=Pr($\overline{E}$)=1−p "r"=number of times that E occurs in "a" trials=random variable with probability density function f(r|a) given by the binomial distribution:

$$Pr(R=r|A=a)=f(r|a)=(a!/(r!(a-r)!))p^r(1-p)^{(a-r)}$$

{The mean value of R}=Exp(R)=a·p, and
{The standard deviation of R}=SD(R)=$\sqrt{[a \cdot p \cdot (1-p)]}$ The above formulas are well known for the binomial distribution.

For the purposes of this hot count scheme we need to know the expectation value of A given some known value of R, and the standard deviation of A given some known value of R. This is because at any given time only the value of R is stored and can be retrieved, and no knowledge of the exact value of A has been retained.

One is tempted to write Exp(A|R=r)=r/p . While this may be correct, to be sure, Bayes Theorem has to be invoked to derive an expression for Pr(R=r|A=a)=f(a|r), and then this probability density function can be used to calculate Exp(A|R=r), and SD(A|R). Bayes Theorem states the following:

$$[Pr(A=a|R=r)] \equiv \left[\frac{Pr(R=r|A=a) \cdot Pr(A=a)}{Pr(R=r)}\right]$$

The denominator of the right hand side of the above equation can be rewritten by using the following identity:

$$Pr(R=r) = \sum_{s=r}^{M} Pr(R=r \ \& \ A=s)$$

where we know the actual count A can never be smaller than the representation R (hence the summation starts from r), and we assume that the actual count A can never exceed some large number M (say: M=1000000 or M=10000000). Therefore {A=r, A=r+1, A=r+2, ..., A=M} forms a partition. Also, by the definition of conditional probability:

$$\sum_{s=r}^{M} \Pr(R=r \ \& \ A=s) \equiv \sum_{s=r}^{M} \Pr(R=r|A=s) \cdot \Pr(A=s)$$

There is a theorem in statistics called "The Admissibility of Uniform Distribution for Bayesian Estimates" that states in cases such as we have here, it is safe to assume that the random variable A is uniformly distributed. In other words, if we assume that the actual count can never exceed M, and we do not know the value of the representation R, then the value of A at some random instance in time can be any integer from 0 to M, with each integer value having the same likelihood as any other. Therefore, $\Pr(A=s)$=constant=$(1/(M+1))$, and we can pull this constant out of the summation:

$$\left[\sum_{s=r}^{M} \Pr(R=r|A=s) \cdot \Pr(A=s)\right] = \left[\Pr(A=s) \cdot \sum_{s=r}^{M} \Pr(R=r|A=s)\right]$$

and because A is uniformly distributed we know that $\Pr(A=s)=\Pr(A=a)$ for any value of s, and any value of a:

$$[Pr(A=a|R=r)] = \left[\frac{Pr(R=r|A=a) \cdot Pr(A=a)}{Pr(R=r)}\right]$$

$$= \left[\frac{Pr(R=r|A=a) \cdot Pr(A=a)}{\sum_{s=r}^{M}[Pr(R=r \ \& \ A=s)]}\right]$$

$$= \left[\frac{Pr(R=r|A=a) \cdot Pr(A=a)}{[Pr(A=s)]\sum_{s=r}^{M}[Pr(R=r|A=s)]}\right]$$

$$= \left[\frac{Pr(R=r|A=a)}{\sum_{s=r}^{M}[Pr(R=r|A=s)]}\right]$$

$$= \frac{\binom{a}{r}p^r(1-p)^{(a-r)}}{\sum_{s=r}^{M}\binom{s}{r}p^r(1-p)^{(a-r)}}$$

where:

$$\binom{a}{r} = \frac{a!}{r!(a-r)!}$$

-continued

Therefore:

$$[Pr(A=a|R=r)] = \frac{\binom{a}{r}p^r(1-p)^{(a-r)}}{\sum_{s=r}^{M}\binom{s}{r}p^r(1-p)^{(s-r)}}$$

$$= \frac{\frac{a!}{r!(a-r)!}p^r(1-p)^{(a-r)}}{\sum_{s=r}^{M}\frac{s!}{r!(s-r)!}p^r(1-p)^{(s-r)}}$$

$$= \frac{\frac{a!}{r!(a-r)!}p^r(1-p)^{(a-r)}}{\frac{1}{r!}\sum_{s=r}^{M}p^r(1-p)^{(s-r)}}$$

$$= \frac{\frac{a!}{(a-r)!}p^r(1-p)^{(a-r)}}{\sum_{s=r}^{M}\frac{s!}{(s-r)!}p^r(1-p)^{(s-r)}}$$

$$= \frac{\left[\prod_{i=0}^{(a-r+1)}(a-i)\right]p^r(1-p)^{(a-r)}}{\sum_{s=r}^{M}\left[\prod_{i=0}^{(a-s+1)}(a-i)\right]p^r(1-p)^{(s-r)}}$$

$$= \frac{p^r(1-p)^{(a-r)}\left[\prod_{i=0}^{(a-r+1)}(a-i)\right]}{p^r\sum_{s=r}^{M}\left[\prod_{i=0}^{(a-s+1)}(a-i)\right](1-p)^{(s-r)}}$$

$$= \frac{(1-p)^{(a-r)}\left[\prod_{i=0}^{(a-r+1)}(a-i)\right]}{\sum_{s=r}^{M}\left[\prod_{i=0}^{(a-s+1)}(a-i)\right](1-p)^{(s-r)}}$$

$$= f(a|r) =$$

probability that (A=a) given that (R=r)

The average value of A given R=r is give by:

$$\text{Exp}(A|R=r) = \sum_{a=0}^{M} a \cdot f(a|r)$$

The variance of (A|R=r) is:

$$\text{Var}(A|R=r) = \text{Exp}(A^2|R=r) - [\text{Exp}(A|R=r)]^2$$

$$= \left[\sum_{a=0}^{M} a^2 \cdot f(a|r)\right] - \left[\sum_{a=0}^{M} a \cdot f(a|r)\right]^2$$

The Standard Deviation of A given R=r is:

$$SD(A|R=r) = \sqrt{\text{Exp}(A^2|R=r) - [\text{Exp}(A|R=r)]^2}$$

$$= \sqrt{\left[\sum_{a=0}^{M} a^2 \cdot f(a|r)\right] - \left[\sum_{a=0}^{M} a \cdot f(a|r)\right]^2}$$

As is apparent from the above formulas, even in this simple case where p=constant, the calculations require computer programs. However, Wald's Equation (See the book STOCHASTIC PROCESSES by Sheldon M. Ross, from John Wiley & Sons (1983) pp 59) can be used to readily arrive at the following expression for: Exp(A|R=r)=Exp(R|A=a)/p=r/p. Therefore, in the case that p=1/4096, then: Exp(A|R=r)=4095·r Another method of calculating both the expectation values, and the standard deviations of A, given some value of R=r is by performing Monte Carlo Simulations. These simulations are particularly useful when a more complicated algorithm is adopted such as the "r dependent p value algorithm" discussed in the next section. Also since any random number generating scheme really generates a pseudo-random number with a distribution that may not be perfectly uniform, the best platform on which to perform the Monte Carlo simulation consists of the same processor and firmware that will go into production. In this way, the imperfections of the random number generating scheme are also incorporated into the simulation.

The Monte Carlo simulation for this simple case will consist of 2 phases. The first phase consists of two loops, with one loop nested inside the other loop. The inner loop will increment the actual count "a" by one upon every pass. Also every time the integer "a" is incremented, a 12 bit random binary integer, b, is generated, if and only if this integer becomes equal to "101111010001" then the representation "r" is incremented. As discussed previously the probability for such a match is 1 in 4096. Note that both "a" and "r" are set to zero within the outer loop, and outside the inner loop. This allows every trial to start with a=0 and r=0. The inner loop is repeated as long as r<256. On the average the inner loop will be run 1 million times. The inner loop simulates what happens to the hot count of a single sector as the sector is cycled for roughly one million times (until r saturates at $255_{10}=11111111_2$). This can be referred to as a single trial. On the other hand, the outer loop simulates many trails. The outer loop can be run 10000 times to produce a statistically significant sample of many trials. In order to minimize the data that has to be stored during the first phase, we need only to record those values of "a" which correspond to incrementing "r". One file can be devoted to each fixed value of "r". So, for example, the file named r123.out will contain 10000 integers which are the values of "a" each time "r" just became 123 across the 10000 trails. We will produce 255 output files. In phase 2, each of the 255 output files is processed to obtain the mean and the standard deviation for each of the 255 nonzero values of "r".

A More Complex Approach Using a Variable Probability Value of Incrementation

A more complex algorithm can be adopted in order to keep the ratio of (the standard deviation of A given R=r) to (the expectation value of A given R=r) more or less constant for different values of "r". This is useful because it limits the relative uncertainty in the value of "a" based on the knowledge of the value of "r". In this new scheme, the probability "p" that "r" gets incremented is related to the current value of "r".

| | | |
|---|---|---|
| If | $0 \leq r < 16$, | then p= $1 / 2^0$ = 1.0 |
| If | $16 \leq r < 32$, | then p = $1 / 2^1$ = 1 / 2 = 0.5 |
| If | $32 \leq r < 48$, | then p = $1 / 2^2$ = 1 / 4 = 0.25 |
| If | $48 \leq r < 64$, | then p = $1 / 2^3$ = 1 / 8 = 0.125 |
| ... | | |
| If | $240 \leq r < 256$, | then p = $1 / 2^{15}$ = 1 / 32768 = 0.0000305 |

"r" can be represented as a simple count from 00000000 to 11111111 in binary form, with a decimal equivalence being from 0 to 255. In Hex, the value of "r" can range from 00h to FFh. Each user of the hot count "r" will be provided with a table that provides a mean value of A, and a standard deviation of A for each of the 256 different values of "r". Alternatively, "r" can be represented in the form of a 4 bit mantissa and a 4 bit exponent, as discussed later. But this later representation is cumbersome at best.

The Monte Carlo simulation for this scheme is very similar to the previously discussed simple scheme, with the difference that now the value of "p" will depend on the current value of "r" as explained above.

A New Hot Count and Counters Scheme for a Specific Memory

Each page (64 sectors) will have a single, Byte long, hot count that will be stored out of the page itself, and in a table in another page. The hot count will be updated in the controller RAM every time it is decided that the count requires incrementing. Every time a page is erased a decision will be made to either increment the corresponding hot count or not to increment it. In this scheme the chances of incrementing the hot count will roughly be inversely proportional to the present value of the count.

The table containing the hot counts will have to be about 5000 Bytes in order to contain the hot counts of about 5000 pages. Assuming $2^{30}$=1 Gbit, then 4096 pages are required to have a user capacity of 1 Gbit. A table consisting of only 10 sectors will be able to contain the hot counts of the entire chip. Each subsequent Byte of this table corresponds to the hot count of the next physical page. As several pages are being written, the hot counts can be updated in the RAM, until a partition boundary is encountered, at which point the sector containing the hot count table corresponding to the partition is updated in one shot. We can define a hot count table as consisting of 64 Bytes each of which is the hot count of a single page which belongs to the same partition. One hot count table is not split across two sectors (i.e. each "hot count table sector" contains 8 entire "hot count tables").

Every time a read or write operation crosses over a partition boundary, then one hot count table sector is updated, and all hot count table sectors are read and processed so that wear leveling, scrubbing, and retirement activity may now be performed. The logical order of the hot count Bytes represents the physical order of the corresponding pages. Also, The logical order of the hot count tables represents the physical order of the corresponding partitions.

Updating of a hot count sector will normally not even require an erase, because as with any other sector, the updating of a sector only requires writing the sector data in a new pre-erased sector, and updating the map to reflect where the most recent version of the data resides. Since a partition consists of 64 pages, the hot counts corresponding to the partition will be 64 bites only. In this scheme the single Byte hot count of each page is incremented only 256 times during a million cycles. So, even if we would update the hot count of each page as soon as it was incremented, and the sector containing the hot counts of 512 pages were never moved around, then the hot count table sector would be updated 512*256=131072 times. This assumes that each and every one of these 512 pages have been cycled 1 million times. If user sectors can tolerate 1 million cycles, then hot count sectors too can tolerate 131 thousand cycles.

The Hot Count Scheme:

The 8 bit count corresponding to each page will consist of 4 bits of mantissa, M, and 4 bits of exponent, E. So if the hot count reads: 01010010, then $M=0101_2=5_{10}$ and $E=0010_2=2_{10}$. Because in this example the exponent is $2_{10}$, we have to add a corrective term, $A=1100_2$ to the mantissa to generate an effective Mantissa, N, where N=N(E), and A=A(E) are functions of E.

Now the actual hot count in base 10 is: $N(E)_{10}*2_{10}**E_{10} = [M+A(E)]*(2**E)$ Alternatively, the hot count in base 2 is: $N(E)*(10)**E$ For counts from 0 to 15 every erase of the page will increment the hot count with 100% certainty. For counts from 16 to 46 every erase has a 50% chance of incrementing the hot count.

In general the probability, p, of incrementing is a function of E given by: $p=1/(2**E)$ The following are values of A(E):
A(0000)=0000,
A(0001)=1000,
A(0010)=1100,
A(0011)=1110,
A(0100)=1111,
A(0101)=1111,
A(0110)=1111,
A(0101)=1111,
A(0111)=1111, The largest possible number, L, is given by M=1111, and E=1111:
$L=(1111+1111)*((10)**(1111))=1015792_{10}$ The smallest p is 1/32768.

This same methodology can be applied to counts of counter activity also. Because cycled cells age more slowly when they have been cycled many times, as compared to the beginning of life, this proportionate hot count will have enough resolution for both wear leveling and retirement purposes.

The invention claimed is:

1. A method of maintaining a compressed count of a number of occurrences of an event that recurs during operation of an electronic system, comprising:
generating a number in response to the individual occurrences of the event,
determining when the incremented count matches a multiple of a first predetermined value, and
in response to the generated number matching a multiple of said first predetermined value, updating a compressed count of the number of occurrences of the event within the system, wherein the compressed count is maintained in non-volatile memory.

2. The method of claim 1, wherein generating a number comprises either incrementing or decrementing of a count.

3. The method of claim 2, wherein the incremented or decremented count is maintained in volatile memory.

4. The method of claim 3, wherein the system comprises a controller including a micro-processor that controls programming of data into addressed blocks of memory cells in the non-volatile memory, reading data from addressed blocks of memory cells and erasing data from one or more of addressed blocks of memory cells at a time, and wherein the volatile memory is part of the controller.

5. The method of claim 1, wherein the non-volatile memory is a flash memory.

6. The method of claim 1, wherein the recurring event includes erasure of an addressed portion of the non-volatile memory.

7. The method of claim 1, wherein generating a number comprises generating a random or pseudo-random number and the multiple of the first predetermined value is the first predetermined value itself.

8. The method of claim 7, wherein the first predetermined value is one of N distinct values of random numbers that are possible to be generated, a maximum number M of events are permitted to occur in the electronic system, and the compressed count is maintained up to at least a number equal to M divided by N.

9. The method of claim 7, additionally comprising seeding a first random number generator upon initialization of the electronic system with a number generated by a second random number generator.

10. The method of claim 7, wherein determining when the generated random number matches said at predetermined value takes into account the number of said events that have cumulatively occurred in order to decrease a probability that the match will occur for an individual generated random number as the cumulative number of said events increases.

11. The method of claim 7, wherein both generating the random number and determining when the random number equals the first predetermined value occur during an individual erase voltage pulse applied to an addressed portion of the non-volatile memory.

12. A non-volatile memory system, comprising:
a plurality of blocks of non-volatile memory cells wherein the cells within individual ones of the blocks are simultaneously erasable,
control circuitry, including a micro-processor, that controls programming of data into addressed blocks of memory cells, reading data from addressed blocks of memory cells and erasing data from one or more of addressed blocks of memory cells at a time,
storage, provided within the plurality of blocks of memory cells, that maintains first counts associated with corresponding individual ones of the memory cell blocks,
number generation circuitry that generates a number in response to a corresponding addressed block being erased, and
a comparator connected to receive and compare the generated number with a first predetermined value,
wherein, in response to the generated number matching a multiple of the first predetermined value, the memory system updates the first count associated with the corresponding addressed block being erased.

13. The non-volatile memory system of claim 12, wherein said controller comprises the number generation circuitry and the comparator.

14. The memory system of claim 12, wherein the number generator is a counter that increments or decrements a second count in response to said corresponding addressed block being erased.

15. The non-volatile memory system of claim 14, wherein the second count is maintained in volatile memory.

16. The non-volatile memory system of claim 15, wherein said controller comprises said volatile memory.

17. The non-volatile memory system of claim 15, further comprising:
 a reserve power source, wherein, in response to an improper shut-down indication, the controller updates the first count based on the incremented value of the second count using said reserve power source.

18. The memory system of claim 12, wherein the number generator is a random or pseudo-random number generator and the multiple of the first predetermined value is the first predetermined value itself.

19. The memory system of claim 18, wherein the number generator is characterized by generating one of a controlled total number of possible different random numbers, and wherein said total number of possible different random numbers is controlled by said first counts.

20. The memory system of claim 12, wherein said plurality of blocks of non-volatile memory cells form a flash memory.

* * * * *